United States Patent [19]

Mogi et al.

[11] 4,322,855
[45] Mar. 30, 1982

[54] REMOTE CONTROL APPARATUS

[75] Inventors: Takao Mogi, Tokyo; Shigetoshi Murakami, Itabashi; Hisao Okada, Yokohama; Yoshio Ishigaki, Tokyo, all of Japan

[73] Assignee: Sony Corporation, Tokyo, Japan

[21] Appl. No.: 160,622

[22] Filed: Jun. 18, 1980

Related U.S. Application Data

[63] Continuation of Ser. No. 3,755, Jan. 15, 1979, abandoned.

[30] Foreign Application Priority Data

Jan. 24, 1978 [JP] Japan .................................. 53-6525

[51] Int. Cl.³ .......................... H04B 1/06; H04N 5/46
[52] U.S. Cl. .................................. 455/151; 358/194.1
[58] Field of Search .................. 455/4, 151, 77, 2, 68, 455/352–355, 88, 603, 5; 358/194.1; 340/694, 152 T, 311–313

[56] References Cited

U.S. PATENT DOCUMENTS

| | | | |
|---|---|---|---|
| 3,668,307 | 6/1972 | Face et al. | 455/5 |
| 3,794,922 | 2/1974 | Osborne et al. | 455/4 |
| 3,987,397 | 10/1976 | Belcher et al. | 455/2 |
| 4,081,747 | 3/1978 | Meyerle | 455/68 |
| 4,156,847 | 5/1979 | Tazawa et al. | 455/5 |
| 4,197,498 | 4/1980 | Fukui et al. | 455/77 |

Primary Examiner—Jin F. Ng
Attorney, Agent, or Firm—Lewis H. Eslinger; Alvin Sinderbrand

[57] ABSTRACT

A remote control apparatus having a commander and a receiver. In a wireless remote control system for a television receiver having a channel command device and a responding device, the channel command device includes a channel selecting circuit for selecting one channel command from among a plurality of predetermined channel commands, a command signal generating circuit for generating a channel command signal corresponding to a selected channel command, and a channel command transmitting circuit having a speaker for transmitting the channel command signal; and the responding device includes a channel command receiving circuit having a microphone for receiving the transmitted channel command signal and a channel command discriminating circuit for discriminating the channel command signal and supplying a channel selecting signal corresponding to the discriminated channel command signal to control a tuning circuit of the television receiver. Further, there is provided in the responding device, a return signal generating circuit for producing a return signal corresponding to the channel command indicated by the channel selecting signal and a return signal transmitting circuit having a speaker for transmitting the return signal, while the channel command device further has a return signal receiving circuit having a microphone for receiving the transmitted return signal, a return signal discriminating circuit for discriminating the return signal and producing a discriminated return signal indicating the channel command to which the return signal corresponds, a comparing circuit for comparing the originally selected channel command and the discriminated return signal, and an indicating circuit connected to the comparing circuit for indicating a coincidence of the originally selected channel command and the discriminated return signal.

11 Claims, 6 Drawing Figures

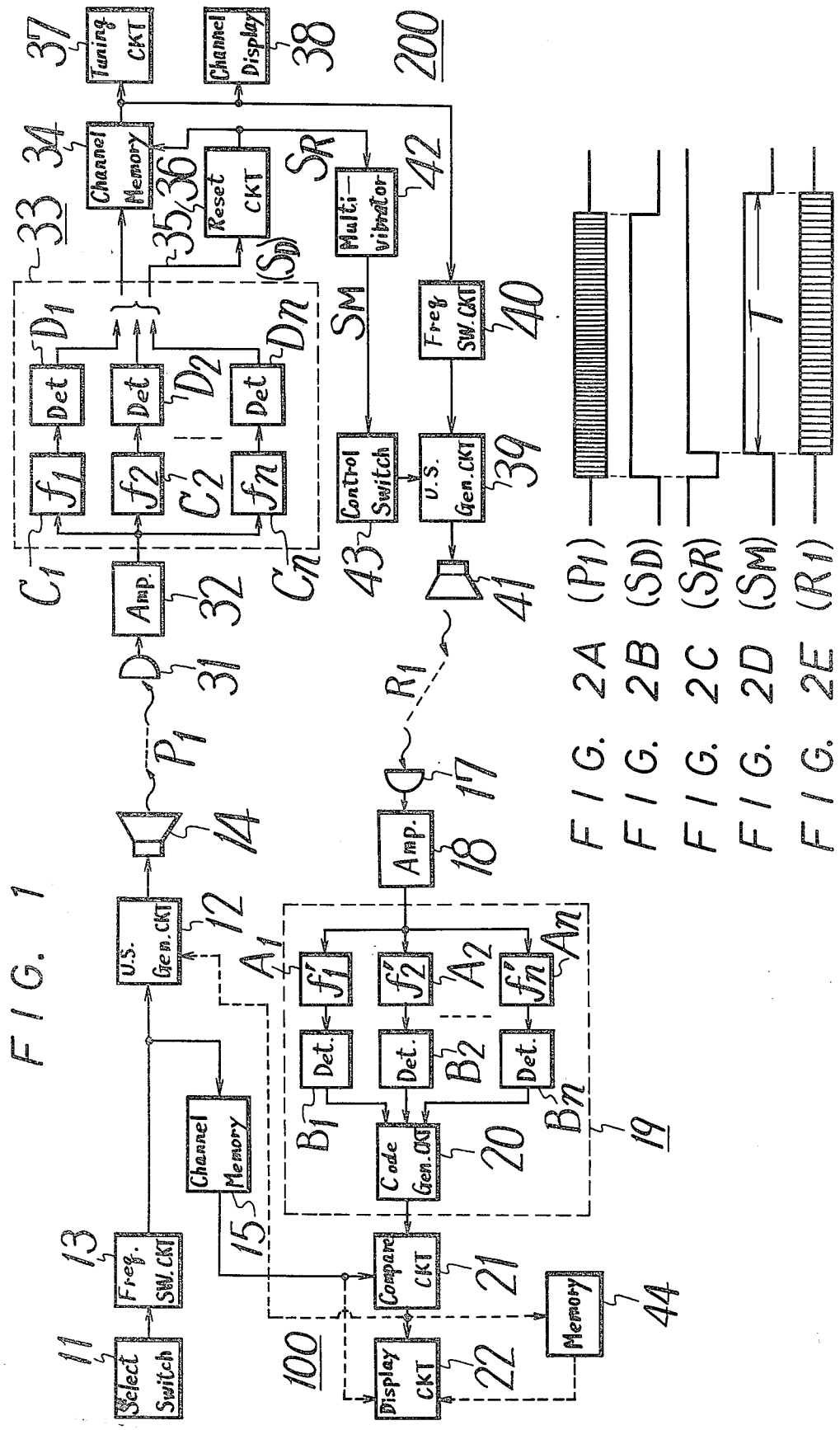

REMOTE CONTROL APPARATUS

This is a continuation of application Ser. No. 3,755, filed Jan. 15, 1979, now abandoned.

BACKGROUND OF THE INVENTION

1. Field of the Invention

The present invention relates to a remote control apparatus such as one suitable for use with a television receiver.

2. Description of the Prior Art

In prior art remote control apparatus used with television receivers, the television receiver selects a channel in response to a channel selecting signal transmitted by the command device of the remote control apparatus and the selected channel is displayed on the television receiver.

With such prior art remote control apparatus, however, depending upon the direction in which the transmitter of the command device is pointed or other factors which may interfere with the transmission of the selected signal. The television receiver may fail to select a channel at all or may select a channel other than the commanded channel. In such a case, if the channel display of the television receiver is small in size or hard to see, a viewer may unwittingly continue to watch an undesired channel. To avoid this defect, it would be possible to make the channel display of the television receiver large or to display the received channel on the cathode ray tube of the television receiver, but in such cases the channel display would become uncomfortable to a viewer of the television receiver.

OBJECTS AND SUMMARY OF THE INVENTION

Accordingly, it is an object of the present invention to provide a remote control system that avoids the above-described difficulties encountered with the prior art.

More particularly, it is an object of this invention to provide a remote control system which enables an operator thereof to easily ascertain whether or not the command transmitted by that system has been properly received.

Another object of this invention is to provide a remote control system for use with a television receiver which will enable an operator thereof to easily ascertain whether or not a channel selection transmitted by that remote control system has been properly received.

In accordance with an aspect of this invention, in a wireless remote control system for a television receiver of the type having a channel command device and a responding device, and in which the channel command device includes channel selecting means for selecting one channel command from among a plurality of predetermined channel commands, command signal generating means for generating a channel command signal corresponding to the selected channel command and channel command transmitting means having a first transducer for transmitting the channel command signal; and the responding device includes channel command receiving means having a second transducer for receiving the transmitted channel command signal and channel command discriminating means for discriminating the channel command signal and supplying a channel selecting signal corresponding to the discriminated channel command signal to a tuning circuit; there are provided in the responding device return signal generating means for producing a return signal corresponding to the channel command indicated by the channel selecting signal and return signal transmitting means having a third transducer for transmitting the return signal, and there are further provided in the command device return signal receiving means having a fourth transducer for receiving the transmitted return signal, return signal discriminating means for discriminating the return signal and producing a discriminated return signal indicating the channel command to which the return signal corresponds, comparing means for comparing the selected channel command and the discriminated return signal, and indicating means connected to the comparing means for indicating a coincidence of the selected channel command and the discriminated return signal.

It is a further feature of the invention that the channel selecting means includes a plurality of channel selecting switches and that the discriminated channel command signal from the channel command discriminating means is adapted to control the tuning circuit of the television receiver.

The above, and other objects, features and advantages of the invention, will be apparent in the following detailed description of an illustrative embodiment of the invention which is to be read in conjunction with the accompanying drawings.

BRIEF DESCRIPTION OF THE DRAWINGS

FIG. 1 is a schematic block diagram showing an embodiment of the present invention; and FIGS. 2A, 2B, 2C, 2D and 2E are waveform diagrams used for the explanation of the operation of the embodiment of the present invention shown in FIG. 1.

DESCRIPTION OF THE PREFERRED EMBODIMENT

Now an embodiment of the present invention will be described with reference to the attached drawings.

FIG. 1 shows an example of a remote control apparatus for use with a television receiver which embodies the present invention. In FIG. 1, reference numeral 100 at the left side generally designates a command device of the remote control apparatus and reference numeral 200 at the right side generally designates a responding device, such as a television receiver, which is remotely controlled by the command device 100.

The command device 100 comprises a function or channel selecting switch group 11 which includes n channel selecting switches (not shown) for selecting one channel command from among n predetermined channel commands. The command device also includes an ultrasonic or supersonic command signal generating circuit 12 and a frequency switching circuit 13 connected between the switch group 11 and the command signal generating circuit 12 for switching the oscillation frequency of the command signal generating circuit 12 to one of the frequencies $f_1, f_2 - - - f_n$ in response to the operation of a corresponding switch of the switch group 11. Together, the frequency switching circuit 13 and the command signal generating circuit 12 generate a channel command signal that corresponds to the channel command selected by the switch group 11. A transducer, such as a speaker 14, is connected to the output side of the command signal generating circuit 12 for transmitting the channel command signal. A channel memory 15 connected to the output of the frequency switching circuit 13 memorizes the frequency switching signal from that circuit after it is converted to a binary channel code. The channel code memorized by memory 15 represents to the channel command selected by the switch group 11.

Within the command device there are further provided a transducer, such as a microphone 17 which receives a return signal transmitted from the responding device 200, an amplifier 18 which will amplify the output of the microphone 17, and a return discriminating circuit 19 which receives the output from the amplifier 18 and includes n band pass filters $A_1, A_2, --- A_n$ for deriving signals with the frequencies $f_1', f_2' --- f_n'$ from the output of the amplifier 18, n detecting circuits $B_1, B_2, --- B_n$ connected to the band pass filters $A_1, A_2, --- A_n$, respectively, and a code generating circuit 20 which receives predetermined detected outputs from the detecting circuits $B_1, B_2, --- B_n$ and produces discriminated return channel codes in response to the predetermined detected outputs.

The discriminated return channel code from the code generating circuit 20 in the return discriminating circuit 19 and the channel code from the channel memory 15 are both applied to a comparing circuit 21 located in the commanding device which then detects whether or not the former channel code is coincident with the latter. The output from the comparing circuit 21 is fed to a display circuit 22 which then indicates whether or not both the channel codes are coincident.

In the responding device 200 there are provided a transducer, such as a microphone 31 which receives the command signal transmitted from the command device 100, an amplifier 32 which will amplify the output from the microphone 31, and a command discriminating circuit 33 which includes n band pass filters $C_1, C_2, --- C_n$ receiving the output of the amplifier 32 for deriving signals with the frequencies $f_1, f_2, --- f_n$ and n detecting circuits $D_1, D_2 --- D_n$ connected to the band pass filters $C_1, C_2, --- C_n$, respectively.

The detected outputs of the detecting circuits $D_1, D_2, --- D_n$ are applied to a discriminated channel command memory 34 which produces a channel code in response to a predetermined detected output and then memorizes that discriminated channel command code. The detected outputs from the detecting circuits $D_1$ to $D_n$ in the discriminating circuit 33 are fed together through a line 35 to a reset circuit 36, which is used to reset the channel memory 34. There are further provided within the responding device a tuning circuit 37 which tunes the television receiver to the channel corresponding to the discriminated channel command code by selecting the terminal voltage of a variable capacitance diode (not shown) and a channel display circuit 38 connected to the output side of the channel memory 34 which indicates the channel to which the television receiver has been tuned.

In the responding device 200, there are also provided a ultrasonic or supersonic return signal generating circuit 39, a frequency switching circuit 40 which switches the oscillation frequency of the return signal generating circuit 39 into one of frequencies $f_1', f_2' --- f_n'$ in response to the channel code from the channel memory 34, and a transducer, such as a speaker 41 which is driven by the output of the return signal generating circuit 39 for transmitting a return signal. Further, provided are a monostable multivibrator 42 supplied with the output from the reset circuit 36 and a power supply control switch 43 for the supersonic return signal generating circuit 39, which switch 43 is controlled by the output of the monostable multivibrator 42.

In the above example of the present invention, the frequencies $f_1, f_2, --- f_n$ and $f_1', f_2', --- f_n'$ are all selected to be different from one another.

Now, the operation of the embodiment of the invention shown in FIG. 1 will be described with reference to FIGS. 2A to 2E.

In order to command the responding devices 200 to select a desired channel, for example, a channel $-1$ which corresponds to the frequency $f_1$, the corresponding switch in the channel selecting switch group 11 of the command device 100 is pushed down. As a result, while the channel selecting switch is pushed down the command signal generating circuit 12 produces a supersonic command signal $P_1$ with the frequency of $f_1$ (refer to FIG. 2A) in response to the signal from the frequency switching circuit 13 and this supersonic command signal $P_1$ is transmitted through the speaker 14. At this time, the channel code corresponding to the channel $-1$ is memorized in the channel memory 15, and this channel code will remain in memory 15 until a different channel is selected.

The command signal $P_1$ with the frequency of $f_1$ transmitted from the command device 100 through its speaker 14 is received by the microphone 31 of the responding device 200 and fed through the amplifier 32 to the discriminating circuit 33. The band pass filter $C_1$ thereof delivers the command signal to the delecting circuit $D_1$, which then produces an amplitude-detected output $S_D$ (shown in FIG. 2B). This output $S_D$ is applied to the channel memory 34.

When the detecting circuit $D_1$ produces the amplitude-detected output $S_D$, this output $S_D$ also appears on the line 35 and is applied to the reset circuit 36. Thus, the reset circuit 36 produces a reset pulse $S_R$ (refer to FIG. 2C). This reset pulse $S_R$ is applied to the channel memory 34, so that the discriminated channel command code previously memorized in the channel memory 34 is rewritten with the discriminated channel command code corresponding to the channel $-1$. As a result, the channel $-1$ is tuned by tuning circuit 37. At this time, since the rewritten discriminated channel command code is fed to the channel display circuit 38, the circuit 38 indicates the reception of the channel $-1$.

In the responding device signal 200, the reset pulse $S_R$ from the reset circuit 36 is applied to the monostable multivibrator 42 to trigger the latter, so that its output $S_M$ becomes "1" for a predetermined time period T (refer to FIG. 2D) from the time when the code is rewritten in the channel memory 34. The power supply control switch 43 connected to the return signal generating circuit 39, which switch 43 is controlled by the output $S_M$ from the monostable multivibrator 42, becomes ON during the time period T and hence the return signal generating circuit 39 produces a return signal $R_1$ (refer to FIG. 2E) with the frequency of $F_1'$ in response to the signal from the frequency switching circuit 40 which is determined by the discriminated channel command code rewritten in the channel memory 34. This supersonic return signal $R_1$ is transmitted through the speaker 41.

The supersonic return signal $R_1$ with the frequency $f_1'$ transmitted from the responding device 200 is received by the microphone 17 of the command device 100 and applied through the amplifier 18 to the return discriminating circuit 19. The signal then passes through the band pass filter $A_1$ and is applied to the detecting circuit $B_1$. Thus, the detecting circuit $B_1$ produces a predetermined detected output which is then fed to the code generating circuit 20. The code generating circuit 20 produces the discriminated return channel code corresponding to the channel $-1$. In this case, since the comparing circuit 21 is supplied with channel codes from the channel memory 15 and the code generating circuit 20 which both correspond to channel $-1$, the comparing circuit 21 produces an output which represents that these two channel codes are coincident. The output from the comparing circuit 21 is applied to the display circuit 22. Thus, for example, a lamp (not shown) is lit in the display circuit 22 verifying that the channel $-1$ is received in the responding device 200.

Since the frequencies $f_1, f_2, --- f_n$ and $f_1', f_2' --- f_n'$ are all different from one another, as set forth previously, even if the supersonic command signal $P_1$ transmitted from the speaker 14 of the command device 100 is received by the microphone 17 of the command device 100, this command signal $P_1$ will not pass through any of the band pass filters $A_1$ to $A_n$ in the return discriminating circuit 19 of the command device 100. Similarly, even if the supersonic return signal $R_1$ transmitted from the speaker 41 of the responding device 200 is received by microphone 31, it will not pass through any of the band pass filters $C_1$ to $C_n$ in the discriminating circuit 33 of the responding device 200. Thus, the transmission of command signals and return signals do not interfere with each other.

If for example, the command device 100 emits or transmits the signal to select the channel $-1$, and the responding device 200 does not discriminate the corresponding channel command, no coincident output will be obtained from the comparing circuit 21 of the command device 100, and hence the lamp of the display circuit 22 will not light. Thus, a user will know that the channel $-1$ has not been selected by the responding device 200.

It is possible to feed the output from the comparing circuit 21 to a memory 44 to be memorized therein and to apply the output from the memory 44 to the display circuit 22 to indicate that a proper channel selection has been made by the responding device even after the channel selecting operation has been finished (as shown by a dotted line in FIG. 1).

It is also possible to feed the output from the channel memory 15 to the display circuit 22 to display the number of the channel selected by the command device 100 is the responding device 200 indicates by its return signal that the channel commanded by the responding device has selected a corresponding channel (as shown by a dotted line in FIG. 1).

Further, instead of the lamp display it is, of course, possible to employ a sound display.

It is also possible to stop the supersonic command signal generating circuit 12 from further generating of the command signal when the comparing circuit 21 produces a coincident output (as shown by a dotted line in FIG. 1).

As described above, according to the present invention it is possible to immediately ascertain by the command device whether or not the responding device has selected the channel commanded by the command device. Thus, the present invention is very convenient.

Having described a specific embodiment of the invention with reference to the accompanying drawings, it is to be understood that the invention is not limited to that precise embodiment and that various changes and modifications may be effected therein by one skilled in the art without departing from the scope or spirit of the invention as defined in the appended claims.

We claim as our invention:

1. In a wireless remote control system for a television receiver having a channel command device and a responding device; and in which said channel command device includes channel selecting means for selecing one channel command from among a plurality of predetermined channel commands, command signal generating means for generating a channel command signal corresponding to said one channel command and channel command transmitting means having a first transducer for transmitting said channel command signal; and said responding device includes channel command receiving means having a second transducer for receiving said transmitted channel command signal and channel command discriminating means for discriminating said channel command signal and supplying a channel selecting signal corresponding to said discriminated channel command signal to a tuning circuit; the improvement comprising:

return signal generating means located in said responding device for producing a return signal corresponding to the channel command indicated by said channel selecting signal;

return signal transmitting means also located in said responding device and having a third transducer for transmitting said return signal;

return signal receiving means located in said command device and having a fourth transducer for receiving the transmitted return signal;

return signal discriminating means located in said command device for discriminating said return signal and producing a discriminated return signal indicating the channel command to which said return signal corresponds;

comparing means located in said command device for comparing said one channel command and said discriminated return signal; and indicating means connected to said comparing means for indicating a coincidence of said one channel command and said discriminated return signal.

2. A wireless remote control system according to claim 1, wherein said channel selecting means includes a plurality of channel selecting switches, and the discriminated channel command signals from said channel command discriminating means are adapted to control said tuning circuit of a television receiver.

3. A wireless remote control system according to claim 1, further comprising memory means located in said channel command device for memorizing said one channel command and supplying a corresponding output signal to said comparing means.

4. A wireless remote control system according to claim 3, wherein said one channel command is stored in said memory means as a code signal.

5. A wireless remote control system according to claim 4, further comprising a code generating circuit located in said channel command device for generating a predetermined code signal in response to the channel command indicated by said discriminated return signal, said predetermined code signal and the code signal from said memory means being compared digitally.

6. A wireless remote control system according to claim 1, wherein said return signal discriminating means includes a plurality of filter means, each adapted to pass signals in a respective frequency band, a plurality of detecting means, each corresponding to a respective one of said filter means for producing a detected output signal in response to signals passed by said respective filter means, and code generating means for producing said discriminated return signal in response to said detected output signals from said detecting means.

7. A wireless remote control system according to claim 1, wherein said first transducer is a speaker which generates a first audio signal in response to an electrical output from said command signal generating means and said second transducer is a microphone which produces an electrical output signal in response to said first audio signal; and said third transducer is a speaker which generates a second audio signal in response to an electrical output from said return signal generating means and said fourth transducer is a microphone which produces an electrical output signal in response to said second audio signal.

8. A wireless remote control system according to claim 7, wherein said first audio signal is generated at a first frequency and said second audio signal is generated at a second frequency which is different from said first frequency.

9. A wireless remote control system according to claim 1, wherein said channel command discriminating means includes a plurality of filter means, each adapted to pass signals in a respective frequency band, and a plurality of detecting means, each corresponding to a respective one of said filter means for producing a detected output signal in response to signals passed by said respective filter means.

10. A wireless remote control system according to claim 1, wherein said return signal generating means includes a generating circuit for producing said return signal and enabling means for enabling said generating circuit to produce said return signal in response to said channel selecting signal.

11. A wireless remote control system according to claim 10, wherein said enabling means includes reset means for producing a reset signal in response to said channel selecting signal, multivibrator means for producing a signal of predetermined duration in response to said reset signal, and switch means for enabling said generating circuit to produce said return signal in response to said signal of predetermined duration.

* * * * *